(12) United States Patent
Henn et al.

(10) Patent No.: US 8,460,804 B2
(45) Date of Patent: Jun. 11, 2013

(54) GLASS OR GLASS-CERAMIC ARTICLE COATED WITH HARD MATERIAL AND METHOD FOR PRODUCTION THEREOF

(75) Inventors: Christian Henn, Frei-Laubersheim (DE); Falk Gabel, Schlangenbad (DE)

(73) Assignee: Schott AG, Mainz (DE)

( * ) Notice: Subject to any disclaimer, the term of this patent is extended or adjusted under 35 U.S.C. 154(b) by 564 days.

(21) Appl. No.: 12/452,712

(22) PCT Filed: Jul. 1, 2008

(86) PCT No.: PCT/EP2008/005346
§ 371 (c)(1),
(2), (4) Date: Feb. 17, 2010

(87) PCT Pub. No.: WO2009/010180
PCT Pub. Date: Jan. 22, 2009

(65) Prior Publication Data
US 2010/0304090 A1    Dec. 2, 2010

(30) Foreign Application Priority Data
Jul. 16, 2007   (DE) .......................... 10 2007 033 338

(51) Int. Cl.
*B32B 15/04*     (2006.01)
*B32B 17/06*     (2006.01)

(52) U.S. Cl.
USPC ............ 428/698; 428/432; 428/689; 428/704

(58) Field of Classification Search
USPC ................. 428/426, 428, 688, 689, 698, 432, 428/704; 204/192.1, 298.01, 298.09
See application file for complete search history.

(56) References Cited

U.S. PATENT DOCUMENTS

| | | | | |
|---|---|---|---|---|
| 4,769,291 A | * | 9/1988 | Belkind et al. | 428/630 |
| 4,781,970 A | * | 11/1988 | Barbee et al. | 428/210 |
| 4,849,081 A | * | 7/1989 | Ross | 204/192.15 |
| 4,957,604 A | * | 9/1990 | Steininger | 204/192.16 |
| 4,995,024 A | * | 2/1991 | Arimune et al. | 369/13.35 |
| 5,108,846 A | * | 4/1992 | Steininger | 428/824.2 |
| 5,137,779 A | * | 8/1992 | Hinz et al. | 428/336 |

(Continued)

FOREIGN PATENT DOCUMENTS

| | | |
|---|---|---|
| DE | 3202709 | 8/1983 |
| DE | 4428015 | 2/1995 |

(Continued)

OTHER PUBLICATIONS

English translation of International Preliminary Report dated Apr. 8, 2010 for corresponding International Application No. PCT/EP2008/005346 (non-English International Preliminary Report previously submitted on Jan. 19, 2010).

(Continued)

*Primary Examiner* — Jennifer McNeil
*Assistant Examiner* — Lauren Colgan
(74) *Attorney, Agent, or Firm* — Ohlandt, Greeley, Ruggiero & Perle, L.L.P.

(57) ABSTRACT

The object of the invention is to create a hard-material coating for glass ceramics and glasses, a coating which is particularly temperature-resistant and protects the substrate from mechanically caused damage as well as chemical attack. For this purpose, a silicon nitride coating is proposed, which has a structure-free morphology in the volume.

23 Claims, 4 Drawing Sheets

U.S. PATENT DOCUMENTS

| | | | |
|---|---|---|---|
| 5,209,996 A * | 5/1993 | Kashida et al. | 430/5 |
| 5,336,643 A * | 8/1994 | Goto et al. | 501/4 |
| 5,344,718 A * | 9/1994 | Hartig et al. | 428/623 |
| 5,455,431 A * | 10/1995 | Manabe et al. | 257/63 |
| 5,530,581 A * | 6/1996 | Cogan | 359/265 |
| 5,554,204 A * | 9/1996 | Kotaka et al. | 65/60.8 |
| 5,561,089 A * | 10/1996 | Ishizaki et al. | 501/10 |
| 5,665,424 A * | 9/1997 | Sherman | 427/109 |
| 5,688,585 A * | 11/1997 | Lingle et al. | 428/216 |
| 5,709,930 A * | 1/1998 | DePauw | 428/216 |
| 5,723,172 A * | 3/1998 | Sherman | 427/109 |
| 5,830,332 A * | 11/1998 | Babich et al. | 204/192.15 |
| 5,972,816 A * | 10/1999 | Goto | 501/4 |
| 6,197,429 B1 * | 3/2001 | Lapp et al. | 428/450 |
| 6,376,402 B1 * | 4/2002 | Pannhorst et al. | 501/66 |
| 6,413,890 B1 * | 7/2002 | Goto | 501/5 |
| 6,495,251 B1 * | 12/2002 | Arbab et al. | 428/336 |
| 6,593,258 B1 * | 7/2003 | Shimatani et al. | 501/4 |
| 6,652,974 B1 * | 11/2003 | Krisko | 428/428 |
| 6,819,526 B2 * | 11/2004 | Kataoka et al. | 360/97.11 |
| 6,942,920 B2 * | 9/2005 | Carre et al. | 428/408 |
| 7,300,896 B2 * | 11/2007 | Zachau et al. | 501/4 |
| 7,413,768 B2 * | 8/2008 | O'Shaughnessy | 427/162 |
| 7,507,478 B2 * | 3/2009 | Maschwitz | 428/428 |
| 7,799,444 B2 * | 9/2010 | Peuchert et al. | 428/701 |
| 2003/0170464 A1 * | 9/2003 | Veerasamy | 428/426 |
| 2003/0215642 A1 * | 11/2003 | Carre et al. | 428/408 |
| 2004/0121146 A1 * | 6/2004 | He et al. | 428/332 |
| 2005/0035704 A1 * | 2/2005 | Kosyachkov | 313/503 |
| 2005/0096208 A1 * | 5/2005 | Zachau et al. | 501/9 |
| 2005/0100721 A1 * | 5/2005 | Dzick | 428/212 |
| 2005/0109606 A1 * | 5/2005 | He et al. | 204/192.14 |
| 2005/0148143 A1 * | 7/2005 | Yang et al. | 438/283 |
| 2005/0214580 A1 * | 9/2005 | Abe et al. | 428/698 |
| 2006/0148270 A1 * | 7/2006 | Lu et al. | 438/763 |
| 2006/0166804 A1 * | 7/2006 | Sprenger et al. | 501/10 |
| 2006/0240266 A1 * | 10/2006 | Schicht et al. | 428/426 |
| 2008/0132080 A1 * | 6/2008 | Anwar et al. | 438/758 |
| 2010/0215950 A1 * | 8/2010 | Schultz et al. | 428/336 |

FOREIGN PATENT DOCUMENTS

| | | |
|---|---|---|
| DE | 20106167 U1 | 6/2001 |
| DE | 10133478 C1 | 8/2003 |
| DE | 102004015217 B2 | 1/2006 |
| EP | 0233062 * | 8/1987 |
| EP | 1705162A1 A1 | 9/2006 |
| WO | WO03050055 | 6/2003 |

OTHER PUBLICATIONS

International Search Report and Written Opinion corresponding to International application No. PCT/EP2008/005346 dated Dec. 3, 2008.

* cited by examiner

GLASS OR GLASS-CERAMIC ARTICLE COATED WITH HARD MATERIAL AND METHOD FOR PRODUCTION THEREOF

The invention in general relates to the technical field of glass-ceramic articles, such as glass-ceramic plates for cooktops, in particular. The invention especially relates to glass-ceramic articles that are provided with a scratch-resistant coating.

Hard-material layers are used for the coating of components and tools in order to prolong their service life. These are generally coatings on metals. Layers such as titanium nitride or WC:C are deposited by means of a method supported by arc discharge with process times of several hours. As a rule, these methods are used in batch plants with metal substrates. The layers produced in these processes are frequently provided with strong stresses, so that on glass/glass-ceramics, they crack when exiting the plants. Crack-free layers on glass and glass-ceramics with decorations are difficult to produce with this technology.

Glass-ceramic cooktops have proven useful for a long time. These cooktops are particularly characterized by their high durability and easy cleaning.

The strength of a glass-ceramic cooktop is influenced, of course, to a special extent also by the surface of the plate. In such cases, scratches may reduce the strength.

This is particularly the case when tensile loads occur along the surface on the scratched side. In the case of a cooktop, these loads usually occur on the top, for example, when an object drops on the cooking surface, or a heavy pot is set down. Since the bottom is usually not scratched based on this specific use, scratches on the top or on the useful surface do not represent a considerable reduction in strength. Of course, scratches nevertheless lead to an unpleasant appearance, on the one hand, and have an adverse effect on cleaning, on the other hand. Therefore, it would be desirable for a high-quality product with a long service life, if the cooking surface could be made more scratch-resistant. This is relevant to the same degree also for other household objects in which strength-reducing effects could also be avoided. In this respect, among other things, glass-ceramic cookware is considered.

A glass-ceramic plate that is coated with a hard material is known from WO 03/050055 A1. Silicon carbide, silicon oxycarbide, silicon nitride, silicon oxynitride and amorphous hydrated carbon are named as hard materials. The deposition of the layers will be produced by plasma-supported chemical vapor-phase deposition.

DE 201 06 167 U1 also describes a glass-ceramic plate of a cooktop, in which the upper side is coated with a layer of hard material. Aluminum oxide, aluminum nitride, zirconium oxide, yttrium oxide, diamond film, diamond-like carbon, silicon nitride, boron nitride, as well as chromium-containing alloys are named as materials for the hard-material layer. The layers can be produced by the sol-gel technique, CVD, ion exchange and sputtering.

Hard-material layers containing silicon nitride are known from DE 699 12 647 T2 and EP 1 705 162 A1, and these contain a mixture of silicon nitride and another hard material. The layers are amorphous or will contain silicon nitride as the amorphous phase.

DE 10 2004 015 217 A1 describes a method for the chemical vapor-phase deposition of thin silicon nitride layers.

In addition, a glass-cermic article with scratch resistance is known from DE 101 33 478 C1. For producing scratch resistance, very fine particles of hard material are stochastically finely distributed in the surface of the article, preferably embedded in an intermediate layer.

When the hard material is coated onto glasses or particularly glass ceramics, however, there are still problems with respect to long-term stability, particularly under repeated thermal load, as well as problems relative to inconspicuous coloring. Even after long-term use, the layers should not have cracks and thus should show their complete scratch-resistant effect. Particularly in the case of hard-material layers for materials with a high thermal expansion coefficient in comparison to glass or glass ceramics, the problem arises that the thermal expansion of the substrate is very small, so that with alternating temperatures, such as occur, e.g., during cooking or on a baking-oven plate, very high, thermally induced mechanical stresses may arise. In the case of a hard-material coating which is stable for a long time, it should not develop cracks based on thermally caused mechanical stresses. Likewise, the layer should not split when high, punctiform mechanical stresses occur, e.g., when a hard object is placed on it or strikes it.

Overall, it can follow from this that the stress state of the hard-material coating on the named substrates must be set such that, despite the thermal load on all typical materials, in particular glass and glass ceramics, the layer adheres completely over the entire time of use. Only then is the required scratch-resistant effect assured, and resistance to chemical attack is at least comparable to that of the respective substrate.

The object of the invention is accordingly to create a hard-material coating for glass ceramics and glasses, which is particularly stable and is suitable for protecting the surface of a glass or glass-ceramic product from mechanical effects, such as they occur in the type of use typical for the articles. Here, this may involve mechanical stress at room temperature or ambient temperature, e.g., with the use of coated glass plates as viewing windows, bar-code scanner covers and similar articles, including cooking applications in the temperature range of up to 800° C. In addition, the object of the invention was also to assure the mechanical stability and freedom from cracks of the hard-material layers even at temperatures of up to 950° C.

In particular, the object of the invention with respect to cooking surfaces or temperature-stressed glass plates is also to provide a mechanical protective coating on the upper or outer side, in order to visibly reduce mechanical attacks that are produced by cooking pots or cleaning media which mechanically attack the surface during the service life of a cooking surface and disturb its appearance. The stability of this layer will find application both in the field of radiation heating as well as in the fields of induction and gas heating. In addition, the layer will possess a uniform, optically inconspicuous appearance, and will not be adversely affected or modified by chemical attack by common household foods and cleaners.

The object is achieved by the embodiments of the present disclosure.

Accordingly, a glass or glass-ceramic article coated with hard material is provided by the invention. At least one silicon nitride layer is deposited on the substrate as a hard-material layer. Particularly in the volume, the silicon nitride layer has a morphology that is substantially without structure, or also called substantially or even completely amorphous. This morphology and the functionality of the layer are maintained in particular, even after one or more annealings at a temperature between 600° C. and 750° C. on the coated surface of the substrate, e.g., for the specific use of the article.

A glass or glass-ceramic article coated with hard material of this type can be produced by a method in which a silicon nitride layer is deposited on a glass or glass-ceramic substrate by sputtering, a power of more than 10 watts per $cm^2$, preferably at least 12 watts per cm² of target surface being utilized for the sputtering. These powers are unusually high. It has been shown, however, that due to the high sputtering power, a strong compacting of the coating is obtained, which then leads to a morphology without structure with its surprisingly advantageous properties.

In order to introduce the layer by sputtering, a silicon target can be used in particular, the sputtering being produced reactively in a nitrogen-containing atmosphere. Reactive magnetron sputtering with the use of a boron-doped silicon target is suitable. An aluminum doping of the silicon target has been proven to be particularly advantageous.

In particular, coated glasses and glass ceramics that can be produced according to the invention have proven to be stable under high temperature, even with a 30-minute temperature load of 900° C. Even after such loading, no cracks or even a detachment of the doped silicon nitride layer were observed.

If glass ceramics are used as a substrate, then amorphous silicon nitride layers according to the invention can be produced that are in fact stable for a long time, even on these glass ceramics, these layers having a temperature expansion coefficient of less than $3*10^{-6} K^{-1}$ in a temperature range between 20° C. and 700° C. This is surprising, since high mechanical stresses arise between the silicon nitride layer and the glass ceramics with alternating temperatures due to the very different heat expansion coefficients.

A preferred material for the substrate is therefore lithium aluminosilicate glass ceramics (LAS glass ceramics), such as often finds use in cooktops. Depending on the field of application each time, however, other glass ceramics, such as magnesium aluminosilicate glass ceramics, for example, are also taken into consideration.

Unlike the structure-free or amorphous silicon nitride layer according to the invention, known hard-material layers, in particular known silicon nitride layers, are generally crystalline or predominantly crystalline. This can be seen, among other things, by cross-sectional micrographs of the respective layer structure.

The coating according to the invention is characterized by a very good adhesion both to glasses as well as to glass ceramics, particularly those with zero expansion, as are used for glass-ceramic cooking surfaces. The good adhesion and temperature stability are thus obviously brought about by the structure-free morphology. Another advantage is that the structure-free morphology contributes to an optically comparatively inconspicuous appearance, since light scattering at crystallites and/or grain boundaries is avoided.

Another very surprising property is that the layer also adheres for a long time and in a temperature-stable manner to a ceramic decoration that has been previously introduced on the glass or the glass ceramic, and that preferably forms a solid bond with the substrate. Therefore, a ceramic decoration, as has been utilized many times on cooking surfaces or baking-oven plates, in order to characterize or decorate specific regions, for example, is also protected from wear.

Yet another characteristic of the layer in the ready-to-use state is the very low layer stress at room temperature. Therefore, it is provided in an enhancement of the invention that the silicon nitride layer has a layer stress with a magnitude of less than 200 MPa at room temperature after an annealing at a temperature between 600° C. and 750° C. on the coated surface of the substrate. Any remaining layer stress at room temperature is preferably compressive stress. This protects the layer from cracking or even splitting when mechanical stresses occur.

The layer stresses are preferably controlled during the production in such a way that the silicon nitride layer has a compressive stress, in particular at higher temperatures. It is particularly favorable if the silicon nitride layer has a compressive stress at a temperature above 450° C. Therefore, favorable values lie in the range between 100 and 500 MPa for compressive stress at 450° C. Based on the compressive stresses at high temperatures, such as they occur, for example, in the operation of a cooktop or a baking oven, the coating also remains mechanically stable at these temperatures. Among other things, a particularly good temperature stability as well as stability with changes in temperature are achieved thereby. For example, it could be shown that a boron-doped or aluminum-doped silicon nitride layer, which is produced on a glass-ceramic substrate according to the invention, also withstood immersion in a container filled with water, which had a temperature of 20-30° C., without cracking and without other damage, even though it had previously been heated together with the glass ceramics to a temperature of up to 500° C. The crack-free withstanding of a quenching test, as described in the preceding, is a general property of the coatings according to the invention, as long as the substrate, for example, borosilicate glass, also withstands this test.

The fact that the silicon nitride layers that can be produced according to the invention have compressive stresses, particularly in the case of high temperatures, is attributed to the fact that a strong compacting of the film is brought about based on the high power densities during sputtering. This also goes along with the fact that the layers at first may have a very high compressive stress after the deposition.

Therefore, in an enhancement of the invention, it is provided that the silicon nitride layer is deposited with a compressive stress, and the compressive stress is eliminated at least partially by means of a one-time annealing or a first-time annealing at a temperature between 600° C. and 750° C. on the coated surface of the glass-ceramic substrate, so that the silicon nitride layer has a layer stress with a value of less than 200 MPa at room temperature. The compressive stress of the silicon nitride layer therefore can amount to at least 600 MPa after the deposition and at room temperature prior to the annealing.

The $Si_3N_4$ layer that is used according to the invention is preferably coated onto the substrate in continuous plants, and particularly preferred, by means of an MF sputtering process, whereby the process times are clearly reduced in comparison to typical hard-material layers, and the layers can be produced free of cracks, as has already been discussed above. This is worthy of note to the extent that in the past, hard-material layers of silicon nitride could be produced free of stress in reality only for very thin layers, and in any case, these layers had poor scratch resistance.

In addition, layer thicknesses in the range of 500 to 2500 nanometers, preferably in the range of 750 to 1500 nanometers, have proven to be favorable for the mechanical properties of the silicon nitride layer. Despite these small layer thicknesses, however, the silicon nitride layers according to the invention in general have excellent values for layer hardness. Thus, Vickers hardness values of greater than 2000 HV (HV=Vickers hardness), even of 2400 HV or more could be measured on the coated side of the substrate. This is also worthy of note and surprising, since silicon nitride layers known in the prior art, and in fact, solid silicon nitride ceramics, have smaller Vickers hardness values. It is known, in particular, that in the case of silicon nitride ceramics, the glassy, i.e, amorphous components themselves reduce the hardness and it is rather the crystalline phase that is the determining criterion for hardness. The fact that the amorphous silicon nitride layers according to the invention have such a high hardness can be attributed obviously to the production method, in which a strong compacting of the layer is achieved due to the high energies during sputtering.

A surprising effect is produced in an enhancement of the invention by doping the silicon nitride layer, for example, with boron or aluminum, in order to improve the layer properties, such as thermal and chemical stability, high mechanical resistance and hardness as well as chemical inertness. An aluminum doping of the silicon nitride layer has proven to be particularly advantageous. It is shown that the chemical resistance of the layer against alkali ions, which is due to the aluminum doping, is permanently achieved up to a temperature range of at least 500-600° C. Accordingly, a further considerable improvement of the chemical and mechanical resistance of the coating and thus also of the glass-ceramic article is achieved by the deposition of aluminum-doped silicon nitride layers. The striking appearance or the conspicuousness can be varied in many ways by the process parameters underlying this invention. In this case, the ratio of the quantities of the components aluminum to silicon in the silicon nitride layer preferably amounts to at least 0.05, and particularly preferred, at least 0.1. In order to produce the aluminum doping, a corresponding aluminum-doped silicon target can be used.

In order to obtain particularly uniform and dense layers, it has additionally proven favorable if the silicon nitride layer is deposited in several, i.e., at least two layer parts. The several layer parts can therefore be produced by moving the glass-ceramic substrate past the sputtering target several times. According to an advantageous enhancement of the method, the substrate to be coated is moved past the sputtering target during the deposition of the silicon nitride layer, the rate of advance amounting at most to 0.5 meter per minute, preferably at most 0.35 meter per minute. If a thin layer is required, or if a very slow movement is selected, the layer may also be deposited in one step or in one single layer part.

For the properties of the silicon nitride layer, especially adhesion to the substrate, thermal resistance capacity and long-term stability, it has additionally been proven favorable if the substrate is preheated. Therefore, the substrate is preferably preheated to a temperature of at least 200° C., particularly preferred at least 350° C.

Fluctuations of the process parameters, of course, can be better equilibrated by depositing in several layer parts, since fluctuations that occur are dispersed to correspondingly larger surfaces of the glass-ceramic substrate. Although the silicon nitride layers in and of themselves according to the invention are without structure, the individual layer parts, however, can be observed, without anything further, on the finished coated substrate, which has been annealed for the purpose of eliminating stress. A glass-ceramic article coated with a hard material, in which the silicon nitride layer has several layer parts directly following one another, can be produced especially with the above-named enhancement of the method according to the invention, the interfaces of the layer parts being visible in an electron micrograph of the cross section with 5 kV accelerating voltage, preferably at 100,000× magnification. In this case, the layer is without structure, except for the interfaces between the layer parts, which can be recognized optionally in the scanning electron microscope. Alternatively, in this case, the layer can also be understood as a composite layer of several individual silicon nitride layers without structure.

Silicon nitride layers have previously proven problematic with respect to their adhesion on glass-ceramic substrates, in particular with alternating temperatures. Thus, it is proposed in WO 03/050055 A1 to insert a silicon oxynitride layer in between in order to improve the adheison. The deposition of an intermediate layer, however, is not necessary in the silicon nitride layers according to the invention. Rather, the silicon nitride layer can be directly deposited on the substrate without an intermediate layer, at least in regions. Of course, intermediate layers may also be provided in regions. This is particularly the case when the silicon nitride layer is introduced onto a surface that has already been provided with a decoration. In the case of regions covered by the decoration, the decoration may then represent an intermediate layer, which typically has a layer thickness of several micrometers.

The feature of the structure-free morphology optionally depends on the measurement method. The layers according to the invention, however, may generally be called x-ray amorphous. This means that sharp interferences that are clearly pronounced, in particular, by more than 10% of the average background signal, do not occur in x-ray diffraction spectra. Instead, in any case, diffuse interference is present with small angles of diffraction. Overall, it can be concluded that, at most, nanocrystalline phases or segregations that have a phase content of less than 10 vol. % exist in the coating. Nevertheless, it has been shown that a silicon nitride layer according to the invention generally has a structure-free morphology, such that it appears to be without structure in an electron micrograph of the cross section with 5 kV accelerating voltage, preferably at 100,000× magnification. It is thus not excluded that individual particles may also be present in the layer, such as, for example, greatly scattered crystallites. In the embodiment examples, which are described later, no structures can be recognized within the layer parts—except, of course, the interfaces between the individual layer parts.

A structure-free surface also does not necessarily go hand in hand with the feature of a structure-free morphology in the layer volume. Conversely, the surface may have a grainy structure throughout when observed in the electron microscope.

Overall, however, the coatings according to the invention have generally proven to be very homogeneous with respect to their layer thickness. Thus, a coating according to the invention can be deposited in such a way that the layer thickness along the layer varies by 5% at most. Of course, this does not necessarily apply to the edge regions of the layer or of the substrate. Such a small variation in the layer thickness, among other things, is thus very advantageous, since color variations on the surface as a result of different types of intereference can be largely avoided, due to the homogeneity of the layer thickness. Even after temperature stresses, the articles according to the invention generally have only very small color changes in the coating. In many cases, color changes $\Delta E$ of less than 1.5 can be observed after an annealing between 600 and 700° C., $\Delta E$ denoting the color distance in the lab color space. In a concrete example, a color change of $\Delta E<1$ could be detected on a 1-micrometer thick $Si_3N_4$ layer on glass ceramics following an annealing at 670° C.

Borosilicate and soda-lime glasses are particularly considered as glasses for the substrates. Since with materials of this type, the substrate expands in the same direction as the silicon nitride layer, the mechanical stresses that occur are generally still lower under temperature loads. Such articles coated with hard material are thus generally at least equivalent to a coated zero-to-low-expanding substrate with respect to stability and thermal resistance. In other respects, the production of the silicon nitride layers according to the invention can be precisely carried out on the other substrates named; thus it can be carried out as described above for the low-expanding glass-ceramic substrate. In addition, other materials also can be coated by the method according to the invention, in order to obtain silicon nitride layers or coated articles that have the corresponding surface properties. Therefore, in addition to the coating of glasses and glass ceramics, it is also conceivable for the coating of plastics and ceramics. Even with these substrate materials, which are not temperature-resistant up to several hundred degrees, however, the property of the layers according to the invention can be detected, that is, the morphology is maintained even after an annealing at a temperature between 600° C. and 750° C., or even up to 950° C. In fact, under certain circumstances, the substrate is hardly present any longer after such an annealing, but at least parts of the coating remain behind, on which the morphology that remains can be detected.

Possible applications of the above-described invention can include all glass-ceramic cooking surfaces or other fields of application, in which temperature loads occur, e.g., fireplace glass plates or baking-oven plates. Of course, it is also possible to utilize articles coated according to the invention for applications in which a high temperature stability of the article is not important. For example, substrates which are subjected to lower application temperatures, i.e., to a range from −40 to +200° C., can be coated. An example of such applications includes, for example, viewing windows, such as, e.g., windows of motor vehicles, airplanes or ships.

The invention will be explained in detail below based on embodiment examples with reference to the appended drawings. The same reference numbers refer to the same or similar elements. Herein:

As a solution to the problem that is the object of the invention: to develop a surface for glass articles or glass-ceramic articles that have better resistance, which also adheres rigidly even under repeated temperature loadings and which does not develop cracks, a scratch-resistant layer was developed, which is deposited preferably as a 0.5-2 µm thick $Si_3N_4$ layer. The selected embodiment examples, which are described below, refer to glass-ceramic substrates, the results being applicable in the same way also to glass substrates.

The layer thickness is typically selected between 1 and 2 µm, in order to obtain a visible mechanical improvement in comparison to an uncoated glass-ceramic cooking surface. The layer is produced in such a way that it has a structure-free morphology, which does not change due to temperature loads of up to approximately 750° C. or even up to 950° C., and thus its properties with respect to mechanical resistance can be maintained. Therefore, it is shown in principle to be suitable for radiation-heated cooking.

For coating, the glass-ceramic plates were positioned on a carrier in a vertical magnetron in-line sputtering plant and sputtered with a rate of advance of 0.25 m/min. Based on this slow rate of advance, 2 pendulum strokes are used in order to introduce a 1-µm thick $Si_3N_4$ layer, so that the layer is deposited in two layer parts. Due to a high sputtering power (>12 kW/cm$^2$) and the thermal pretreatment of the substrate ($\geqq$400° C.) prior to the actual coating process, very dense and x-ray amorphous layers are obtained, which do not change their tribological properties after temperature treatment, as will also be demonstrated further based on the following examples.

The mechanical resistance was evaluated in a linear scrubbing test with different abrasive materials (such as, for example, sandpaper of varying granulation) and weights applied onto the abrasive materials, as well as in a test with a circular abrasive load. The difference in the scrubbing test with sandpaper will be explained further below on the basis of FIG. 1. In the case of the circular abrasive load, categorization is produced via classes, class 5 standing for no improvement relative to the uncoated substrate, and class 1 standing for optimal improvement and no visible damage. According to this latter test, a 1-µm silicon nitride layer can be classified as 2-3 and a 2-µm silicon nitride layer can be classified is 2. Accordingly, there is a clear improvement relative to the uncoated material.

Figure 1:
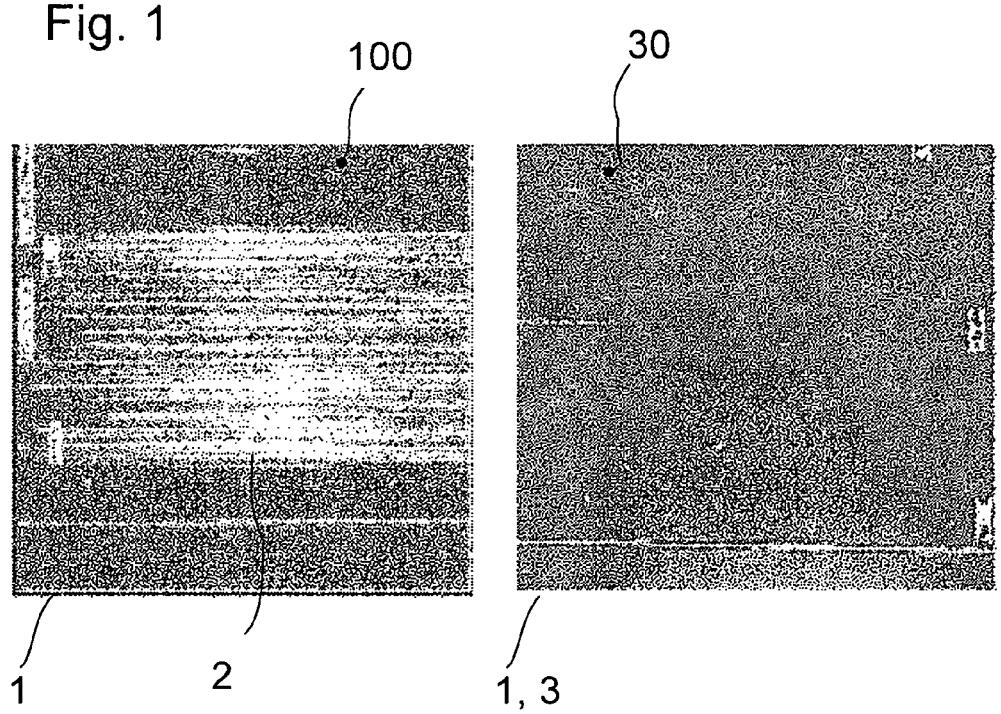
FIG. 1 shows two photomicrographs of glass-ceramic substrates after a scratch test, the left photomicrograph showing an uncoated substrate, and the right photomicrograph showing a substrate coated with a silicon nitride layer.

The improvement in mechanical resistance is shown by way of example in FIG. 1. Shown in FIG. 1 are two photomicrographs of glass-ceramic substrates, each of which had been subjected to an identical treatment with sandpaper. The micrograph on the left shows the result of an untreated surface 100 of a glass-ceramic plate 1. The scratches 2, which the sandpaper has introduced in the surface, can be clearly recognized running horizontally in the micrographs. The micrograph on the right shows an identical glass-ceramic plate, which is provided with a silicon nitride layer 3. Surface 30 of silicon nitride layer 3, as can be recognized based on the micrograph, is essentially unchanged after the scratch test.

The layer is characterized overall by the fact that it has good adhesion both to the substrate as well as also to the decoration. With an uncracked decoration, the layer also remains free of cracks after temperature loading. Cracks that are already present in the decoration do not produce a crack formation in the coating. This is caused by the fact that the layer is produced in such a way that after coating, an intense compressive stress prevails in the layer, which is almost abolished by temperature loads. After thermal loads, the silicon nitride layer is nearly free of stress or is provided with only slight compressive stress, which prevents a cracking of the layer. In particular, after an annealing at a temperature between 600° C. and 750° C., in fact, at a maximum temperature of 800-950° C. on the coated surface of the substrate, the layer stress can be less than 200 MPa in magnitude at room temperature.

Figure 2:
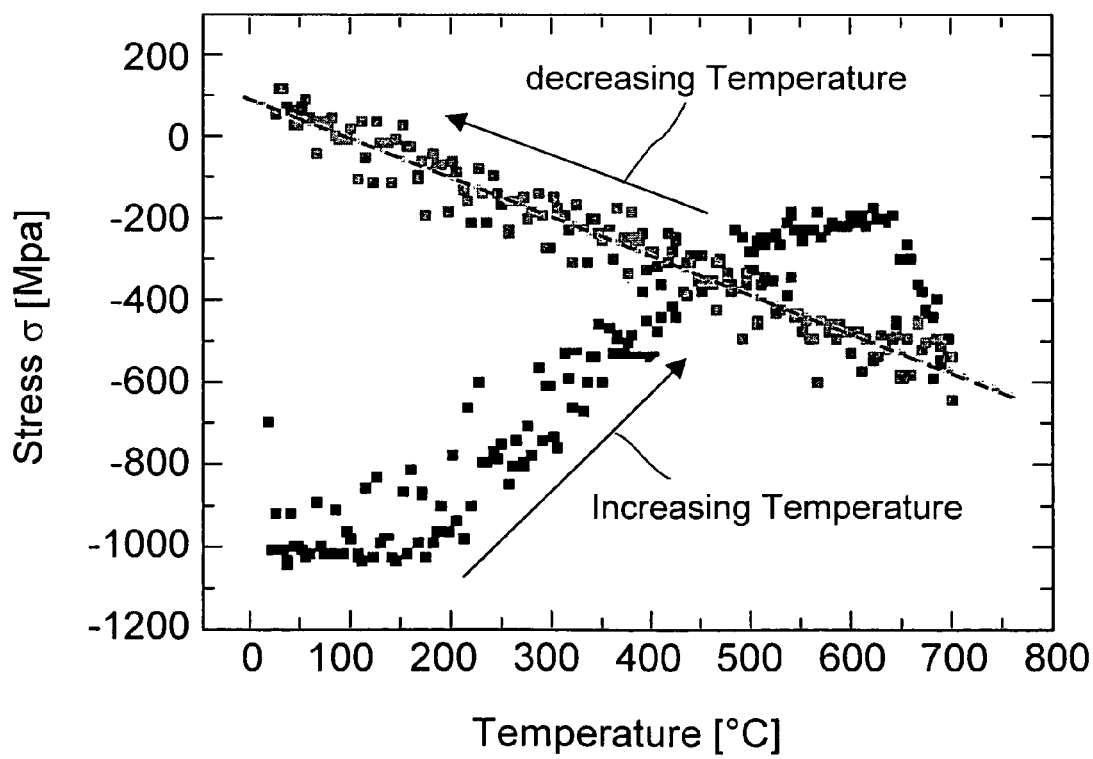
FIG. 2 shows measurements of the layer stress during the annealing after the coating.

For this purpose, FIG. 2 shows the stress curve for a first annealing of the freshly deposited layer. The freshly deposited layer first has a high compressive stress of a magnitude clearly higher than 600 MPa. In the example shown, the layer stress at room temperature in fact amounts to approximately −1000 Mpa, the negative sign here indicating a compressive stress. If the temperature is now increased, then the compressive stress decreases in magnitude and reaches a local minimum at approximately 650° C., whereupon the compressive stress again increases somewhat in magnitude and reaches approximately −500 MPa to −600 MPa in the temperature range between 600° C. and 750° C. Now, if the temperature decreases again and the annealing process has ended, the layer stress decreases in magnitude to below 200 MPa at room temperature, preferably a slight compressive stress being maintained. Subsequently, if the temperature is increased again, for example, in operating the cooktop, then the layer stress essentially runs along the leg that it has last passed through, which is characterized in FIG. 2 by the arrow denoted "decreasing temperature".

Therefore, as FIG. 2 illustrates, the layer has a compressive stress in later operation, at least at higher temperatures, e.g., of 450° C., even if the layer should be stress-free at room temperature or even stand under slight tensile stress. A compressive stress of approximately −250 MPa to −350 MPa would prevail in the layer during a subsequent heating to 450° C. in the example shown in FIG. 2. In particular, repeated heating to temperatures of at least 600-750° C. also do not lead to essential changes in the layer.

Figure 3:
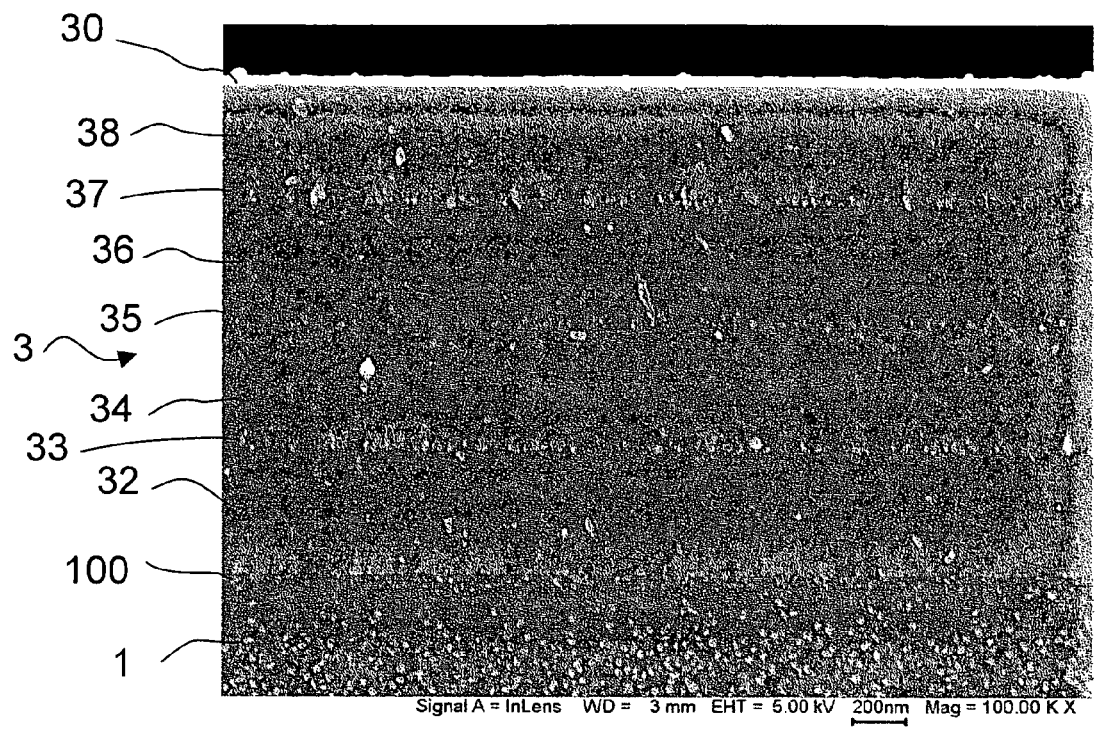
FIG. 3 shows an electron micrograph of a layer according to the invention, which has been deposited with high sputtering power prior to annealing.
Figure 4:
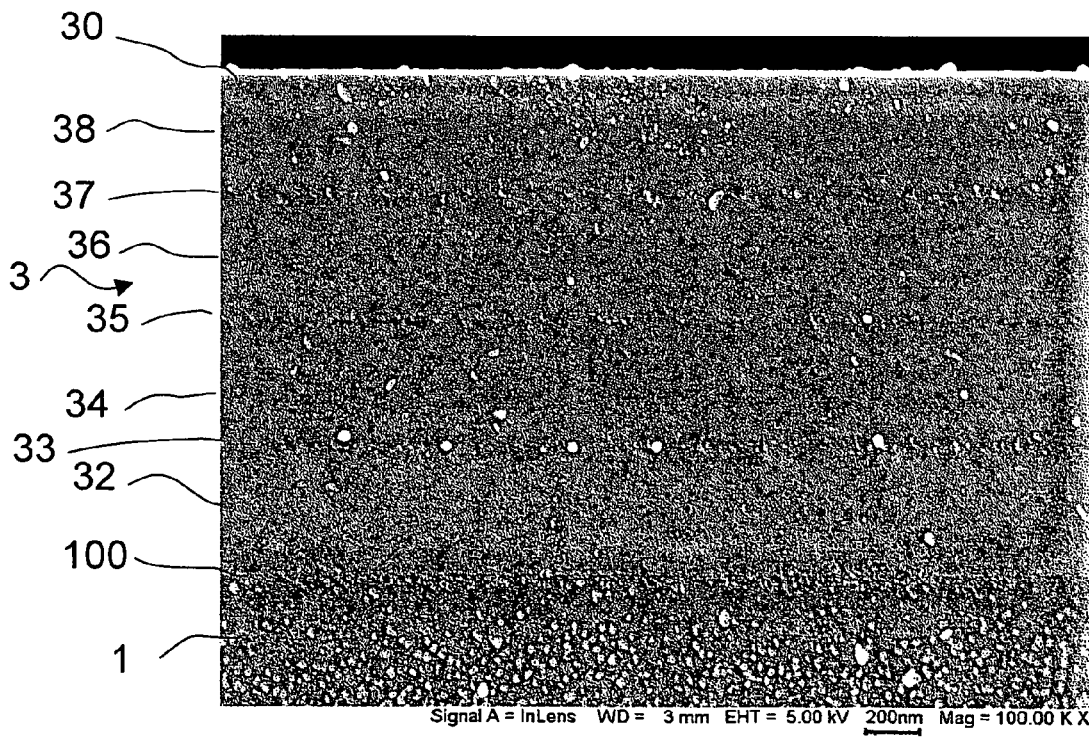
FIG. 4 shows an electron micrograph of the same layer after annealing.

FIG. 3 shows an electron micrograph of a silicon nitride layer 3 according to the invention, which has been deposited with high sputtering power on a glass-ceramic substrate 1, prior to annealing; FIG. 4 shows a micrograph of the same layer 3 after an annealing, as it was described above on the basis of FIG. 2. The micrographs were taken with an accelerating voltage of 5 kV at 100,000× magnification. A scale bar with a length of 200 nanometers is presented under each of the the micrographs.

The coating was executed in a continuous plant by means of an MF sputtering process by magnetron sputtering, as was described above based on FIG. 1, the substrate having been preheated inside the coating plant. In this case, the glass-ceramic substrate 1 was moved past the sputtering target at a slow rate of advance of less than 0.35 meter per minute. In order to obtain a sufficient layer thickness, the substrate was therefore moved past the target in a pendulum motion several times, four times in the example shown. Due to this motion, the silicon nitride layer is deposited in the form of a stack of four layer parts 32, 34, 36, 38. In the example shown in FIGS. 3 and 4, each of the layer parts 32, 34, 36, 38 has a thickness of 500 nanometers, so that layer 3 overall has a layer thickness of 2 micrometers.

As can be recognized based on the two electron micrographs, the individual layer parts 32, 34, 36, 38 can be well recognized due to interfaces 33, 35, 37 between the layer parts. Except for these interfaces, the layer volume otherwise appears to be without structure at the selected accelerating voltage and magnification. This particularly applies also to layer 3 after annealing, as is illustrated based on FIG. 4. Overall, layer 3 does not show a significant visible change after annealing. Also, no variation in the layer thickness can be recognized, which demonstrates the high stability of layer 3. In addition, the layer thickness is also very constant along the layer due to the sputtering process and varies less than 5%.

Figure 7:
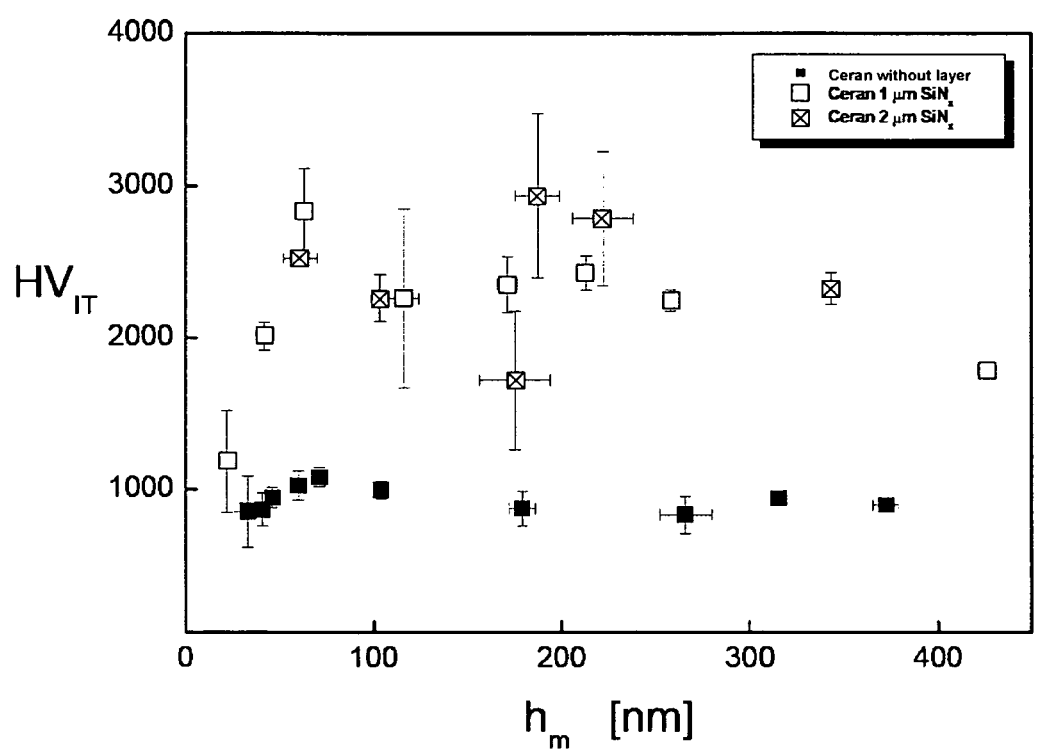
FIG. 7 shows measurements of the Vickers hardness for an uncoated LAS glass-ceramic substrate, for an LAS glass-ceramic substrate substrate coated with a 1-micrometer thick silicon nitride layer, and for an LAS glass-ceramic substrate coated with a 2-micrometer thick silicon nitride layer.

The layer also has an extraordinary hardness. Vickers hardness values of 2200 to 2400 were measured on a layer that was only half as thick, i.e., 1 micrometer, on a glass-ceramic substrate. In this regard, FIG. 7 shows measurements of Vickers hardness for different penetration depths $h_m$. The filled squares thus represent measurement points on an uncoated CERAN®—LAS glass-ceramic plate, the empty squares represent the measurement points on a plate of the same type which was provided with a 1-micrometer thick silicon nitride layer, and the squares with X's represent measurement points on a plate of the same type which was provided with a 2-micrometer thick silicon nitride layer.

The difference in Vickers hardness between the coated plates and the uncoated plates is considerable. In section, an increase in hardness by at least a factor of 3.5 is attained. Conversely, the difference between the two coated plates is only slight. The Vickers hardness values are particularly comparable for greater penetration depths. For this reason, layer thicknesses in the range from 750 to 1500 micrometers are preferred, since these layers can be produced in a more cost-effective manner.

Figure 5:
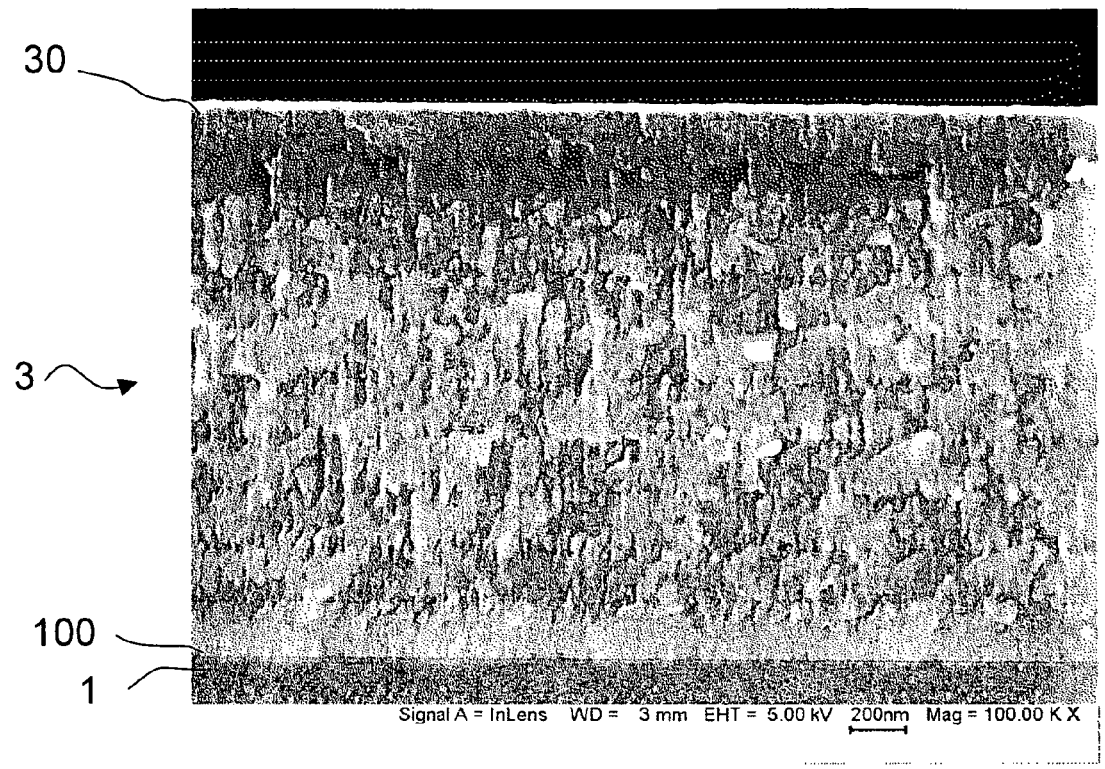
FIG. 5 shows an electron micrograph of a layer which has been deposited with lower sputtering power prior to annealing.
Figure 6:
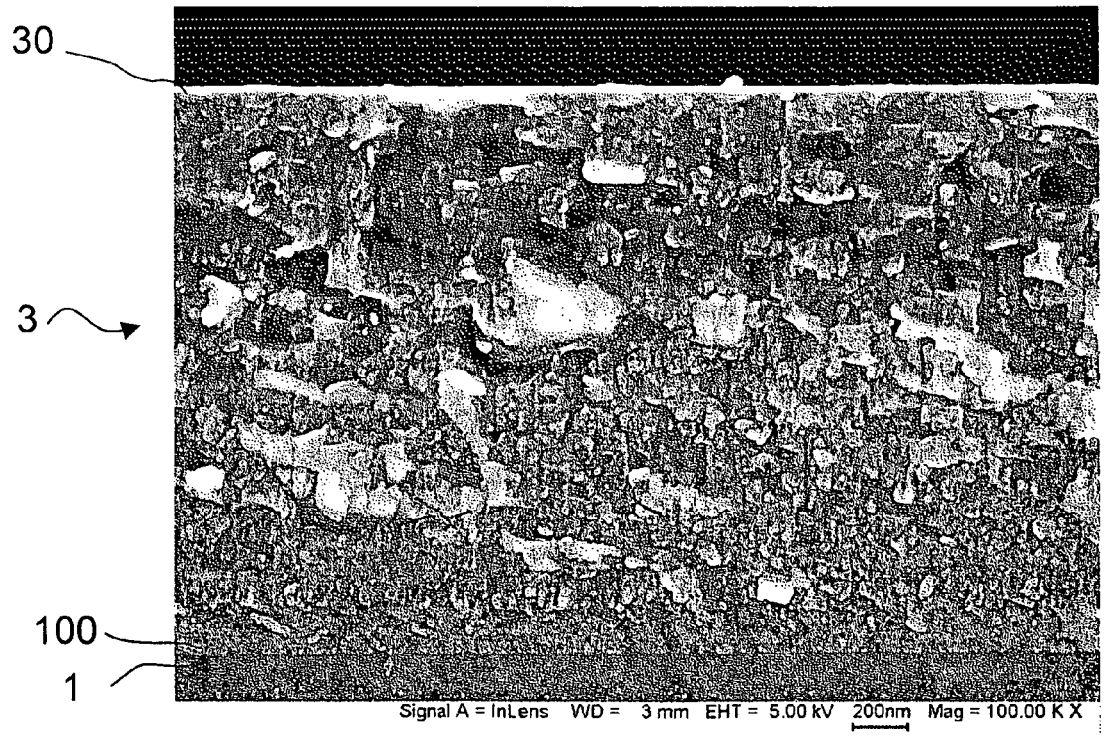
FIG. 6 shows an electron micrograph of the same layer after annealing.

For comparison with the glass-ceramic substrates coated with hard material that can be produced according to the invention and are illustrated in FIGS. 3 and 4, FIGS. 5 and 6 show a comparative example of a layer deposited at lower power density. Corresponding to FIG. 3, FIG. 5 shows the silicon nitride layer directly after sputtering and FIG. 6 shows the layer after an annealing up to a temperature of approximately 700° C. The parameters for the electron micrographs correspond to those of FIGS. 3 and 4, i.e, the micrographs were taken at the same accelerating voltage and magnification.

The power density that was used for the deposition of the silicon nitride layer, however, was only half the magnitude of that given in the example shown in FIGS. 3 and 4 and thus lay in the range of common parameters that are used in sputtering.

In comparison to the unannealed layer which was deposited according to the invention and is shown in FIG. 3, the layer according to FIG. 5 shows a strong columnar-type growth structure which is even more clearly pronounced in FIG. 6 after annealing. As shown in FIGS. 5 and 6, the layer is not structure-free, either before or after annealing.

It is obvious to the person skilled in the art that the invention is not limited to the exemplary embodiments described above, but rather can be varied in many ways. The invention was described especially on the basis of glass-ceramic substrates, but it is also applicable in a corresponding manner, to glass substrates, such as borosilicate or soda-lime glasses, and even plastics and ceramics.

The invention claimed is:

1. A glass or glass-ceramic article coated with hard material having a glass substrate or a glass-ceramic substrate, comprising:
    a silicon nitride layer is deposited on the substrate as a hard-material layer, wherein the silicon nitride layer has an x-ray amorphous morphology in the volume, and has a structure-free morphology such that it appears structure-free in an electron micrograph of the cross section with 5 kV accelerating voltage at 100,000× magnification.

2. The glass or glass-ceramic article of claim 1, further comprising a ceramic decoration on the substrate, the hard-material layer being deposited over the ceramic decoration.

3. The glass or glass-ceramic article of claim 1, wherein the coated surface of the substrate is annealed at a temperature between 600° C. and 750° C. and wherein the morphology of the silicon nitride layer is after the annealing.

4. The glass or glass-ceramic article of claim 1, wherein the coated surface of the substrate is annealed at a temperature between 600° C. and 750° C. and wherein the silicon nitride layer has a layer stress with a value of less than 200 MPa at room temperature after the annealing.

5. The glass or glass-ceramic article of claim 1, wherein the coated surface of the substrate is annealed at a temperature between 600° C. and 750° C. and wherein the silicon nitride layer has a compressive stress at room temperature after the annealing.

6. The glass or glass-ceramic article of claim 1, wherein the silicon nitride layer has a compressive stress at a temperature above 450° C.

7. The glass or glass-ceramic article of claim 6, wherein the compressive stress at 450° C. lies in the range between 100 and 500 MPa.

8. The glass or glass-ceramic article of claim 1, wherein the silicon nitride layer has a layer thickness in the range of 500 to 2500 nanometers.

9. The glass or glass-ceramic article of claim 1, wherein the silicon nitride layer has a layer thickness in the range of 750 to 1500 nanometers.

10. The glass or glass-ceramic article of claim 1, wherein the silicon nitride layer is on a surface of the substrate having a layer thickness of at least 1 µm and a Vickers hardness of more than 2000 HV.

11. The glass or glass-ceramic article of claim 1, wherein the silicon nitride layer is on a surface of the substrate having a layer thickness of at least 1 µm and a Vickers hardness of at least 2400 HV.

12. The glass or glass-ceramic article of claim 1, wherein the silicon nitride layer is an aluminum-doped silicon nitride layer.

13. The glass or glass-ceramic article of claim 12, wherein the silicon nitride layer has a ratio of aluminum to silicon of at least 0.05.

14. The glass or glass-ceramic article of claim 12, wherein the silicon nitride layer has a ratio of aluminum to silicon of at least 0.1.

15. The glass or glass-ceramic article of claim 1, wherein the silicon nitride layer has at least two layer parts directly following one another defining an interface, the interface being visible in an electron micrograph of the cross section with 5 kV accelerating voltage at 100,000× magnification.

16. The glass or glass-ceramic article of claim 1, wherein the silicon nitride layer is directly, at least in regions, on the substrate, without intermediate layer therebetween.

17. The glass or glass-ceramic article of claim 1, wherein the silicon nitride layer has a layer thickness that varies by at most 5% along the layer.

18. The glass or glass-ceramic article of claim 1, wherein the substrate is selected from the group consisting of a glass ceramic, a borosilicate glass, and a soda-lime glass.

19. The glass or glass-ceramic article of claim 18, wherein the substrate is the glass ceramic and the glass ceramic has a linear temperature expansion coefficient of less than $3*10^{-6}$ $K^{-1}$ in a temperature range between 20° C. and 700° C.

20. The glass or glass-ceramic article of claim 1, wherein the glass or glass-ceramic article is annealed at between 600 and 700° C. and shows a color change ΔE of less than 1.5 after the annealing, ΔE denoting the color distance in the lab color space.

21. A glass or glass-ceramic article coated with hard material having a glass substrate or a glass-ceramic substrate, comprising:
a silicon nitride layer deposited by sputtering at a power of more than 10 watts per cm² of target surface on the substrate as a hard-material layer with a layer thickness of at least 1 µm and a Vickers hardness of more than 2000 HV, wherein the silicon nitride layer has an x-ray amorphous morphology in the volume, and has a structure-free morphology such that it appears structure-free in an electron micrograph of the cross section with 5 kV accelerating voltage at 100,000× magnification.

22. The glass or glass-ceramic article of claim 21, wherein the Vickers hardness is at least 2400 HV.

23. The glass or glass-ceramic article of claim 21, wherein the power is at least 12 watts per cm² of target surface.

* * * * *